(12) United States Patent
Malhotra

(10) Patent No.: US 9,118,447 B1
(45) Date of Patent: *Aug. 25, 2015

(54) SAMPLING POSITION TUNING

(71) Applicant: Xilinx, Inc., San Jose, CA (US)

(72) Inventor: Gaurav Malhotra, Cupertino, CA (US)

(73) Assignee: XILINX, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/561,813

(22) Filed: Dec. 5, 2014

Related U.S. Application Data

(63) Continuation of application No. 14/053,416, filed on Oct. 14, 2013, now Pat. No. 8,934,594.

(51) Int. Cl.
*H04L 27/06* (2006.01)
*H04L 1/00* (2006.01)

(52) U.S. Cl.
CPC .................................. *H04L 1/0054* (2013.01)

(58) Field of Classification Search
CPC . H04L 27/2338; H04L 7/0337; H04L 7/0334; H04L 7/091; H04L 7/033; H04L 7/0029
USPC .................................................. 375/341, 355
See application file for complete search history.

(56) References Cited

U.S. PATENT DOCUMENTS

| 6,509,773 | B2 | 1/2003 | Buchwald et al. |
| 2005/0031065 | A1 | 2/2005 | Gupta et al. |
| 2005/0180536 | A1 | 8/2005 | Payne et al. |
| 2006/0181319 | A1 | 8/2006 | Zhang |
| 2006/0253746 | A1 | 11/2006 | Momtaz |
| 2010/0169699 | A1 | 7/2010 | Fujimoto |
| 2012/0038400 | A1 | 2/2012 | Talaga |
| 2012/0127009 | A1* | 5/2012 | Pagnanelli .................... 341/143 |
| 2014/0266338 | A1* | 9/2014 | Malipatil et al. .............. 327/155 |

OTHER PUBLICATIONS

Specification and drawings for U.S. Appl. No. 14/053,416, filed Oct. 14, 2013, Malhotra.

* cited by examiner

*Primary Examiner* — Juan A Torres
(74) *Attorney, Agent, or Firm* — W. Eric Webostad

(57) ABSTRACT

An apparatus generally relating to a receiver is disclosed. In this apparatus, the receiver includes a phase interpolator, a detector and a slicer. The slicer is coupled to the phase interpolator to provide a sampling signal for a sampling position of the phase interpolator. The detector is coupled to the slicer to receive the sampling signal. The detector is configured to adjust a code of the phase interpolator to adjust the sampling position iteratively in response to the sampling signal to tune the sampling position of the receiver toward an optimum therefor.

18 Claims, 14 Drawing Sheets

SAMPLING POSITION TUNING

CROSS-REFERENCE TO RELATED APPLICATIONS

This application is a continuation of co-pending, commonly assigned application Ser. No. 14/053,416, by Gaurav Malhotra, entitled "Sampling Position Tuning" and filed Oct. 14, 2013, which is incorporated herein by reference.

TECHNICAL FIELD

The following description relates to integrated circuit devices ("ICs"). More particularly, the following description relates to sampling position tuning for an IC.

BACKGROUND

Transmitted information may include data represented by symbols. Such symbols may be sampled with a data slicer of a receiver at a sampling position set in a phase interpolator of such receiver. However, such sampling position, namely at an interpolated phase sampling point, may be less than desirable due to an asymmetric data eye ("eye") and/or a sampling phase position that is not one-half of a period T (i.e., 180 degrees) of an eye away from a corresponding data crossing ("d×d"). An eye may be asymmetric for any of several reasons, including without limitation precursor inter-symbol interference ("ISI"). Variation from a T/2 sampling position from a d×d may be due to any of several reasons, including without limitation layout and/or routing mismatches.

Hence, it would be desirable and useful to provide sampling position tuning that overcomes one or more of the above-described limitations. "Sampling position" is sometimes referred to as "sampling phase", and thus sampling position tuning may be include "sampling phase optimization".

SUMMARY

A method relates generally to sampling position tuning. In such a method, an input signaling is received by a receiver. The input signaling has symbols and is provided via a communications channel. Operation of a loop of the receiver is temporarily suspended, where such loop is associated with adaptation to the communications channel for an error slicer. Whether a current sampling phase for the error slicer is identified as being sufficiently close to an optimum sampling point for sampling the symbols. The current sampling phase is for a setting of a phase interpolator. The identifying includes: determining a first mean for a first error slicer output of the error slicer at a phase interpolator code location for the current sampling phase; incrementing with reference to the phase interpolator code location to provide a first candidate sampling phase of the error slicer; determining a second mean for a second error slicer output of the error slicer at the first candidate sampling phase; decrementing with reference to the phase interpolator code location to provide a second candidate sampling phase of the error slicer; determining a third mean for a third error slicer output of the error slicer at the second candidate sampling phase; determining whether a magnitude of the second mean is larger than a magnitude of the third mean; and determining whether a difference in magnitude as between the first mean and the larger magnitude as between the second mean and the third mean is less than a threshold value. If the difference is less than the threshold value, then the current sampling phase set in the phase interpolator for the error slicer is sufficiently close to the optimum sampling point for the sampling of the symbols by the receiver. Data is output in response to the sampling of the symbols by the error slicer at the current sampling phase.

Another method relates generally to sampling position tuning. In such a method, an input signaling is received by a receiver. The input signaling has symbols and is provided via a communications channel. Operation of a loop of the receiver is temporarily suspended, where such loop is associated with adaptation to the communications channel for an error slicer. Whether a current sampling phase for the error slicer is identified as being at an optimum sampling point for sampling the symbols. The current sampling phase is for a setting of a phase interpolator. The identifying includes: incrementing with reference to a phase interpolator code location for the current sampling phase to provide a first candidate sampling phase of the error slicer; determining a first mean for a first error slicer output of the error slicer at the first candidate sampling phase; decrementing with reference to the phase interpolator code location to provide a second candidate sampling phase of the error slicer; determining a second mean for a second error slicer output of the error slicer at the second candidate sampling phase; and determining whether a sign of the first mean and a sign of the second mean are equal. If the sign of each of the first mean and the second mean are equal, then the current sampling phase set in the phase interpolator for the error slicer is at the optimum sampling point for the sampling of the symbols by the receiver. Data is output in response to the sampling of the symbols by the error slicer at the current sampling phase.

An apparatus generally relates to a receiver. In such an apparatus, the receiver includes a phase interpolator, a detector and a slicer. The slicer is coupled to the phase interpolator to provide a sampling signal for a sampling position of the phase interpolator. The detector is coupled to the slicer to receive the sampling signal. The detector is configured to adjust a code of the phase interpolator to adjust the sampling position iteratively in response to the sampling signal to tune the sampling position of the receiver toward an optimum therefor. An apparatus generally relating to a receiver includes a phase interpolator, a detector, and a slicer. The slicer is coupled to the phase interpolator to provide a sampling signal for a sampling position of the phase interpolator. The detector is coupled to the slicer to receive the sampling signal. The detector is configured to adjust a code of the phase interpolator to adjust the sampling position in response to the sampling signal.

BRIEF DESCRIPTION OF THE DRAWINGS

Accompanying drawings show exemplary apparatus(es) and/or method(s). However, the accompanying drawings should not be taken to limit the scope of the claims, but are for explanation and understanding only.

FIGS. 9-1 and 9-2 are graphical diagrams depicting an exemplary sampling instance of a data crossing ("d×d") versus error slicer output mean plot for a curve.

FIG. 10-1 is a flow diagram depicting exemplary operations for identifying a direction for the exemplary sample position tuning flow of FIG. 5.

FIG. 10-2 is a flow diagram depicting exemplary operations for identifying a direction for the exemplary sample position tuning flow of FIG. 6.

FIG. 11-1 is a flow diagram depicting exemplary operations for determining a direction to move for the exemplary sample position tuning flow of FIG. 5.

FIG. 11-2 is a flow diagram depicting exemplary operations for determining a direction to move for the exemplary sample position tuning flow of FIG. 6.

FIG. 12-1 is a flow diagram depicting exemplary operations for resetting for the exemplary sample position tuning flow of FIG. 5.

FIG. 12-2 is a flow diagram depicting exemplary operations for resetting for the exemplary sample position tuning flow of FIG. 6.

DETAILED DESCRIPTION

Figure 1:
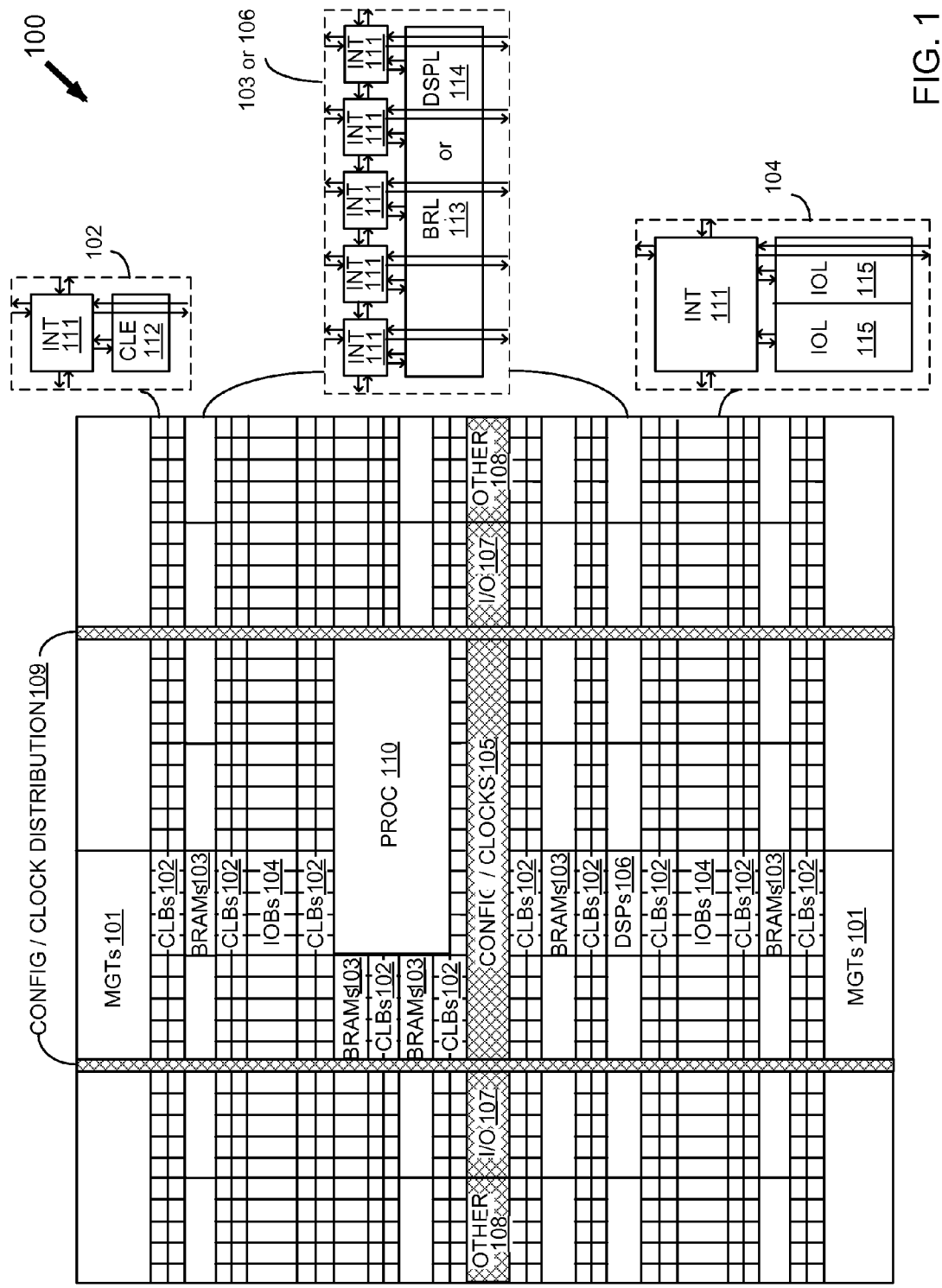
FIG. 1 is a simplified block diagram depicting an exemplary columnar Field Programmable Gate Array ("FPGA") architecture.

In the following description, numerous specific details are set forth to provide a more thorough description of the specific examples described herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Before describing the examples illustratively depicted in the several figures, a general introduction is provided to further understanding.

Generally, system performance of a receiver is enhanced when sampling at or sufficiently close to an optimum sampling point. For a serializer-deserializer ("SERDES") environment, data recovery is enhanced by sampling symbols at a phase position having a maximum opening of an eye ("maximum eye opening phase"). At such maximum eye opening phase position, a signal-to-noise ratio ("SNR") may be at a maximum. For a perfectly symmetric eye without any layout/routing or any other circuit mismatch, a maximum eye opening phase position corresponds to data symbols being sampled ½ unit interval ("UI") away from a corresponding data crossing. However, in practice, due to asymmetric eyes and/or different delays, such as due to circuit mismatches for example, on data crossings, data symbols may not be sampled at an optimum sampling point, which harms performance.

Along those lines, sample position tuning is described below. Such sample position tuning may be used to adjust a phase interpolator to sample at an optimum or sufficiently close to an optimum sampling phase to improve performance. Such sample position tuning may include detecting an optimum phase location and correcting data slicer sampling to match such optimum phase location to correct for data crossing issues due to mismatched delays. Such optimum phase sampling position may be determined for a symmetric or an asymmetric eye.

With the above general understanding borne in mind, various configurations for sampling position tuning are generally described below.

Because one or more of the above-described examples are described herein using a particular type of IC, a detailed description of such an IC is provided below. However, it should be understood that other types of ICs may benefit from one or more of the techniques described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Figure 2:
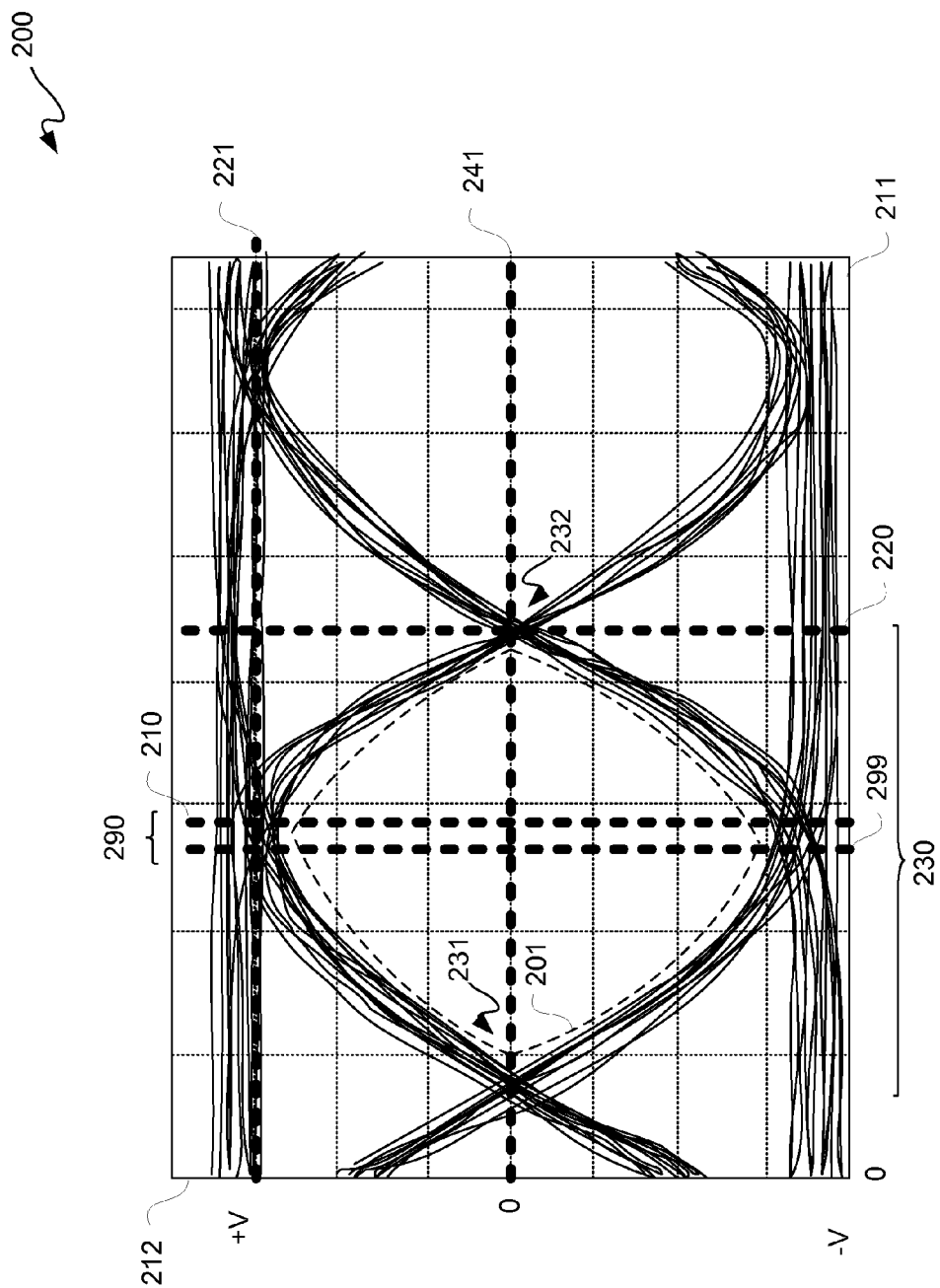
FIG. 2 is a signal diagram depicting exemplary received signaling forming data eyes for uncorrelated data.
Figure 3:
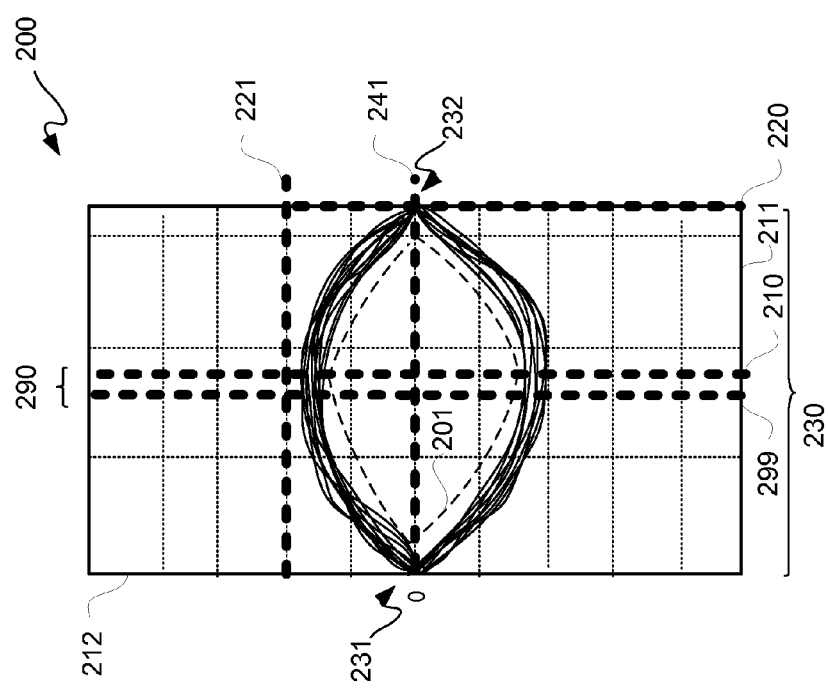
FIG. 3 is a signal diagram depicting exemplary received signaling forming data eyes for correlated data.

FIG. 2 is a signal diagram depicting exemplary received signaling 200 forming data eyes, such as for example generally data eye 201, for uncorrelated data. Signaling 200 in FIG. 2 is for received transmitted "random" data, namely generally there is no correlation between individual data samples. FIG. 3 is a signal diagram depicting exemplary received signaling 200 forming data eyes, such as for example generally data eye 201, for correlated data. Signaling 200 in FIG. 3 is for received transmitted "non-random" data, such as a fixed data pattern for example. A common example of a fixed data pattern is a clock pattern formed by sending a logic 1 followed by a logic 0 and repeating. Of course, this is just one example of a fixed data pattern, as there are many possible fixed data patterns. The following description is applicable to sampling either or both correlated and uncorrelated data. With simultaneous reference to FIGS. 2 and 3, signaling 200 is further described.

Data eye 201 may be described using a phase, as generally indicated by sampling phase horizontal axis 211, and amplitude, as generally indicated by voltage vertical axis 212, of received signaling 200. For example, sampling phase may be in units of a phase interpolator ("PI") code, and amplitude may be in units of volts.

For purposes of clarity by way of example and not limitation, it shall be assumed that a non-return-to-zero ("NRZ") form of signaling is used, and thus zero crossings, such as generally zero crossings 231 and 232 for example, may be used for sampling. However, in another implementation, NRZ inverted ("NRZI") or a non-zero crossing form of signaling may be used. Furthermore, even though the following description is generally in relation to a binary pulse amplitude modulation ("PAM"), such as an NRZ/PAM-2, mode of communication, the following description is applicable to PAM-4 or other types of modulation.

A zero crossing or data crossing is where a signal crosses a 0 voltage level, such as a zero voltage level or threshold 241, along voltage vertical axis 212, which may be detected as a change from a positive to a negative voltage, or vice versa. Distance 230 between adjacent data crossings may be defined to be a unit interval ("UI"). A UI is a measure of time, may be defined in terms of a PI code. For example, if a PI has 64 codes, a UI may be 64 units or increments of a PI code. This is just one example, and another number of codes or increments of a PI code may be used. Accordingly, distance 230 may be defined as 360 degrees or IF radians. Another term used to described a time instance of a signal, such as in lieu of PI code, may be sampling phase or sampling phase point or position.

For random data, each received signal of signaling 200 does not necessarily cross at the same exact zero crossing location with respect to a PI code location, and likewise each received signal of signaling 200 does not necessarily peak at the same exact peak voltage location with respect to a PI code location. Along those lines, a first slicer, which may be referred to as an error slicer, may be set to sample at a PI code location 210. PI code location 210 may be an anticipated location of voltage peaks of sampled signals of signaling 200. Likewise, a second slicer, which may be referred to as a crossing slicer, may be set to sample at another PI code location 220. In this example, an error slicer and a crossing slicer are configured to sample 180 degrees apart from one another, namely half of a symbol width or UI, namely half of width or distance 230, from each other. PI code location 220 may be an anticipated location of zero crossings of sampled signals of signaling 200. A slicer or a data slicer may be set to sample a data eye ("eye") at a tap of a chain of taps of a PI representing a point in time and may convert such sample to a logic 0 or 1 depending on the sign of such sampled data.

An error slicer may be set to determine whether a voltage is above (including equal to) or below a voltage peak threshold, such as generally indicated as voltage peak threshold 221, at PI code location 210. While output of such an error slicer may be a logic 1 or a logic 0, such sampling is for determining an error state of data and not a data state of data. Thus, output of an error slicer may be thought of as an error on a plus side +e or error on a minus side −e, depending on whether a sampled signal is above or below, respectively, a voltage peak threshold when sampled at PI code location 210. Mean output of an error slicer for "random" data generally has a mean of zero for a sufficient number of samples, meaning that half of such samples will be above voltage peak threshold 221 when sampled at PI code location 210 and the other half of such samples will be below such voltage peak threshold when sampled at PI code location 210.

A crossing slicer may be set to determine whether a voltage is above (including equal to) or below a zero volts threshold at PI code location 220. While output of such a crossing slicer may be a logic 1 or a logic 0, such sampling is for determining a crossing state of data and not a data state of data. Thus, output of a crossing slicer may be a late error +t or an early error −t, depending on whether a sampled signal is after or before, respectively, a PI code location 220 for sampling of a zero voltage level or threshold 241 crossing. Mean output of a crossing slicer for "random" data generally has a mean of zero for a sufficient number of samples, meaning that half of such zero crossing samples will be before PI code location 220 and the other half of such zero crossing samples will be after PI code location 220.

PI code location 210 may be set by default to 180 degrees away from PI code location 220. However, in this example, PI code location 210 is sub-optimal, and PI code location 299 is an optimal sampling phase point or closer to an optimal sampling phase point than PI code location 210. Heretofore, because PI code location 210 was conventionally set for an ideal eye and phase relationship and deviations from such ideals were conventionally not predictable, a conventional receiver did not automatically correct for such sub-optimal sampling, namely correct by an offset 290. Even though in this example optimal PI code location 299 leads in phase with respect to PI code location 210, in another implementation PI code location 200 may lag in phase with respect to that of PI code location 210. Additionally, even though eye 201 is asymmetric, in another implementation eye 201 may be more or less asymmetric, which asymmetry may vary with precursor ISI.

Figure 4:
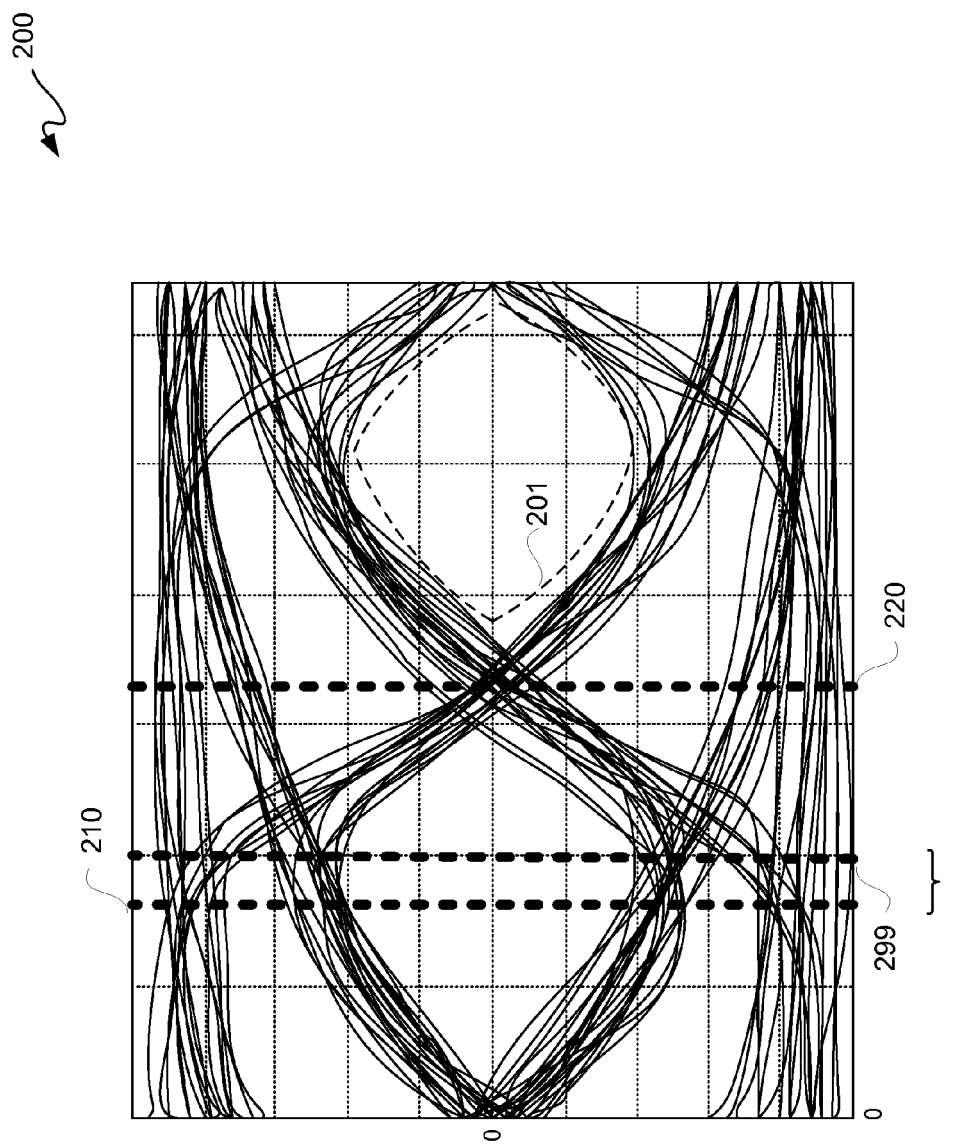
FIG. 4 is a signal diagram depicting other exemplary received signaling forming data eyes for uncorrelated data.

Along those lines, FIG. 4 is a signal diagram depicting exemplary received signaling 200 forming data eyes 201 which are more asymmetric for uncorrelated data. In this example, optimal PI code location 299 lags default PI code location 210.

In any of the examples of FIGS. 2 through 4, there may be an offset 290 from an optimal PI code location 299 and a default set PI code location 210 for sampling by an error slicer of a receiver. Such offset 290 may be due to eye asymmetric and/or data crossing mismatched delays, and such offset 290 may be a fixed time delay. For faster data rates, a symbol period is shorter, and so an offset or deviation 290 in optimal sampling phase may consume a larger proportion of a symbol period for faster data rates, which may in turn lead to a greater degradation in performance. Conventionally, sampling point optimization may have been performed manually based on heuristics.

Figure 5:
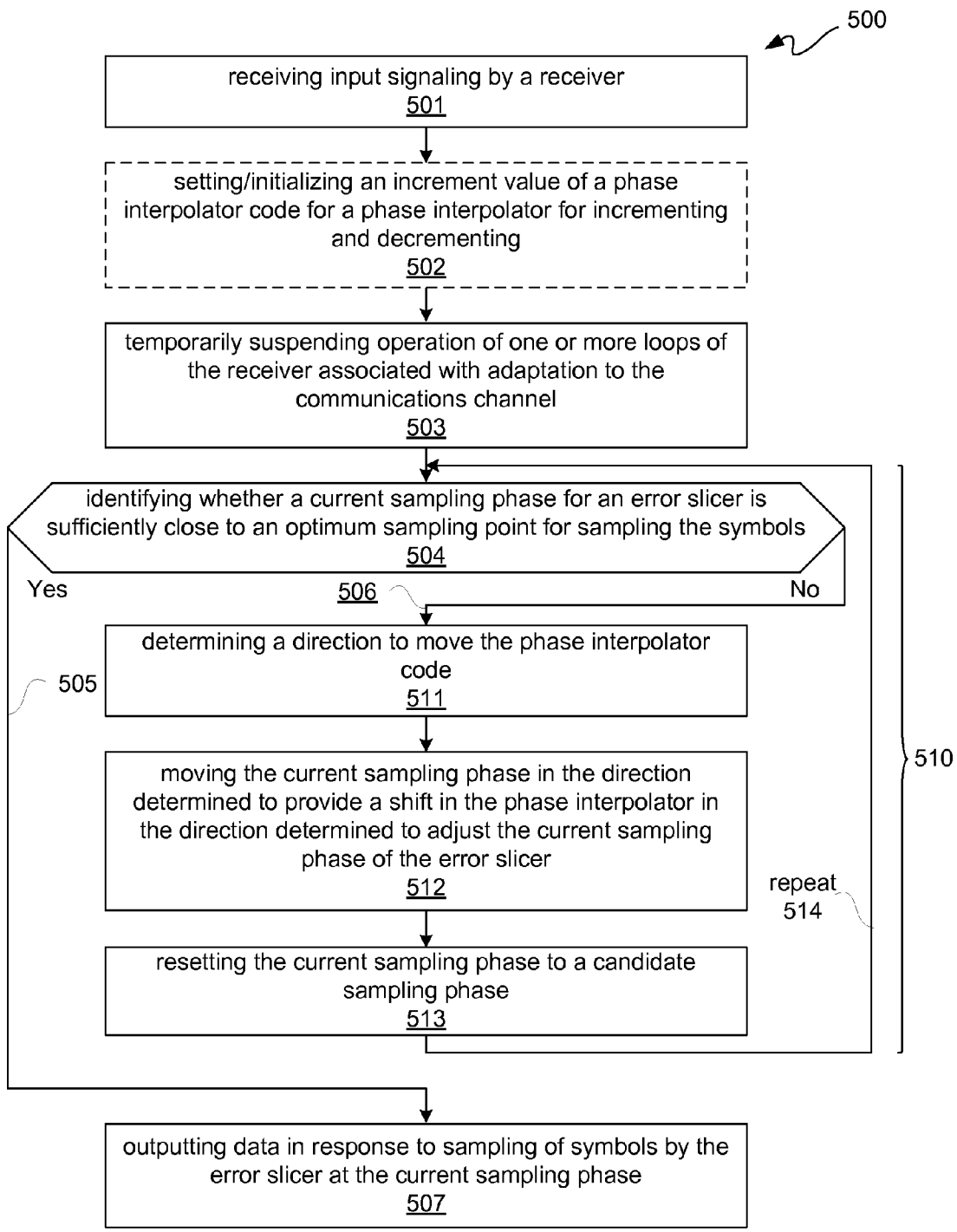
FIG. 5 is a flow diagram depicting an exemplary sample position tuning flow.
Figure 6:
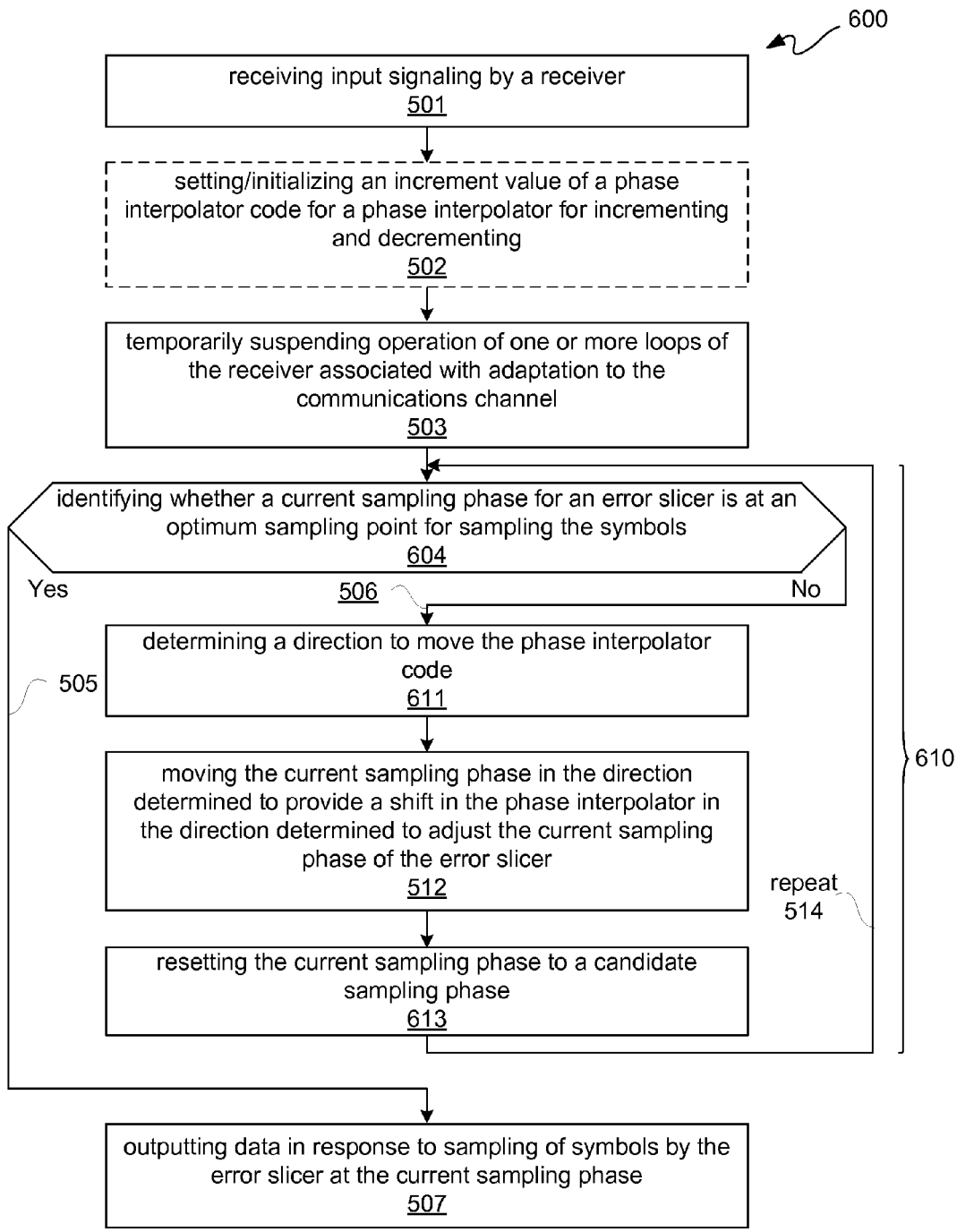
FIG. 6 is a flow diagram depicting another exemplary sample position tuning flow.

With the above description borne in mind, sampling position tuning is described, including a systematic optimization of a sampling point is described. Such sampling position tuning may detect an optimum sampling phase location and correct a data slicer sampling to correspond to such optimum sampling phase location. Such correction may thus automatically address a data crossing mismatch error due to differences in delay between an error slicer and a crossing slicer. Furthermore, such correction of sampling phase may be used for symmetric and asymmetric eyes. FIG. 5 is a flow diagram depicting an exemplary sample position tuning flow 500 using magnitudes. FIG. 6 is a flow diagram depicting an exemplary sample position tuning flow 600 using relative position.

Figure 7:
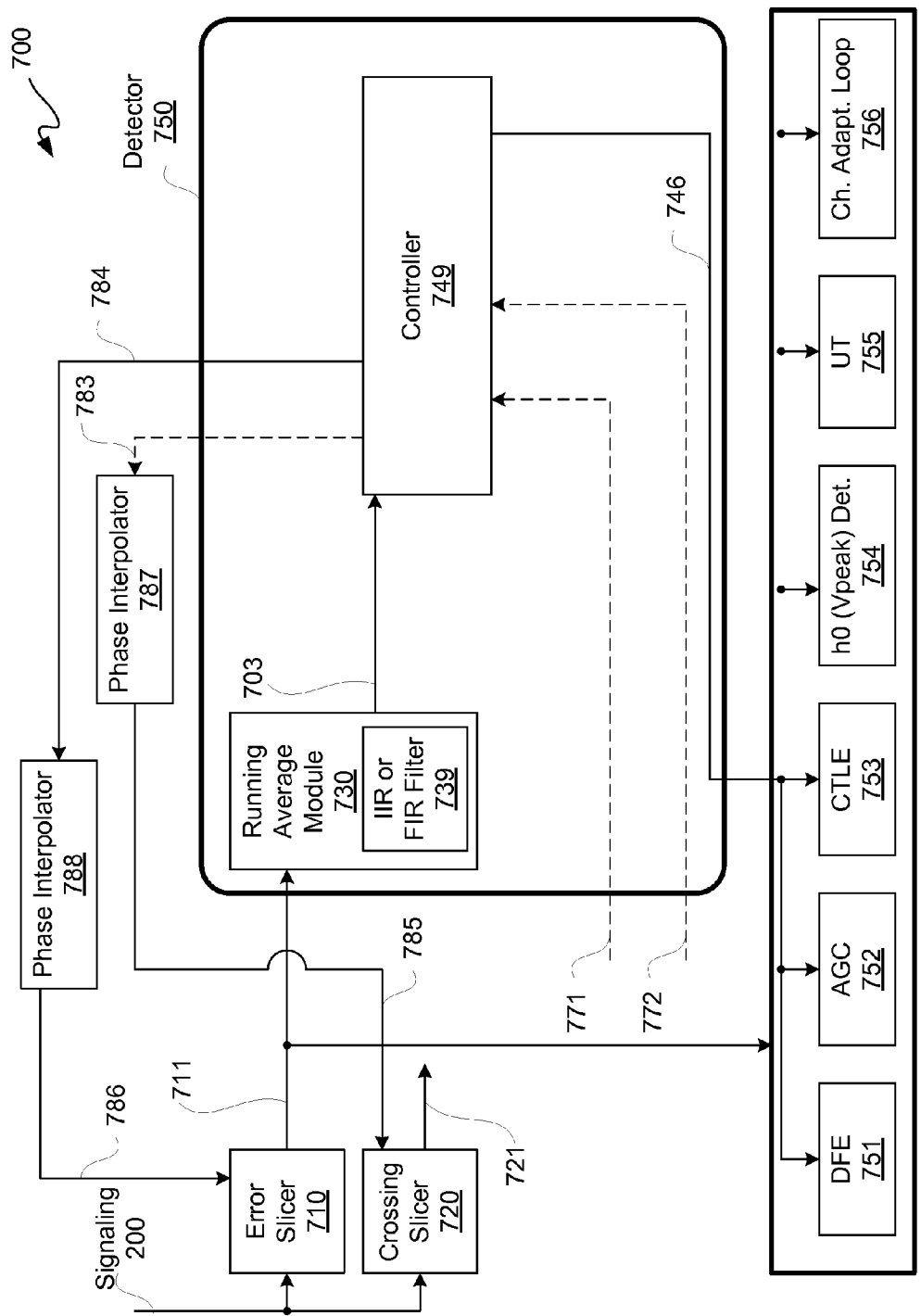
FIG. 7 is a block diagram depicting an exemplary receiver.

FIG. 7 is a block diagram depicting an exemplary receiver 700. Receiver 700 may be of a gigabit transceiver ("GTX") of an FPGA, such as of FPGA 100 of FIG. 1, or of any other type of IC having a receiver or a transceiver that is used for sampling symbols to obtain data. Furthermore, receiver 700 may be used to provide a serializer-deserializer ("SERDES") for high-speed communication. Additional details regarding a GTX of an FPGA may be found in a User Guide entitled "GTX/GTH Transceivers" (UG476 version 1.9.1) published on Apr. 22, 2013 by Xilinx, Inc. of San Jose, Calif., in particular at FIG. 4-20 at page 192 and at FIG. 4-22 at page 201. However, many of these details, such as various clock signals as well as various physical medium attachment ("PMA") and physical coding sublayer ("PCS") components for example, regarding a GTX are unnecessary for description of receiver 700, and thus are omitted for purposes of clarity and not limitation.

Receiver 700 may include an error slicer or data sampler 710, a crossing slicer or edge sampler 720, phase interpolators 787 and 788, a detector 750, and one or more channel adaptive loop blocks, such as channel adaptive loop blocks 751 through 756 for example. Signaling 200 may be input to error slicer 710 and crossing slicer 720. As described below in additional detail, crossing slicer 720 may be used as a reference from which to reposition a sampling position of error slicer 710. Signaling 200 may have previously been processed by a receiver 700, such as for linear equalization ("LE") and/or decision feedback equalization ("DFE") prior to being input to slicers 710 and 720. A phase interpolator ("PI") 788 may be coupled to error slicer 710 to provide a current phase sampling signal 786 for a current PI code location in phase interpolator 788 for a sampling phase for error slicer 710. Likewise, a phase interpolator 787 may be coupled to crossing slicer 720 to provide a current phase sampling signal 785 for a current PI code location in phase interpolator 787 for a sampling phase for crossing slicer 720. By default, such PI code locations respectively associated with current phase sampling signals 785 and 786 may be for code locations that are 180 degrees out of phase with respect to one another, such as one-half of a UI.

Phase interpolators 787 and 788 may be of a clock data recovery ("CDR") module, and along those lines detector 750 may be part of a CDR controller. Such a CDR controller may include a finite state machine ("FSM"), and detector 750 may be included as part of such CDR FSM. Even though the following description is in terms of an FPGA implementation, the description hereof is not limited to an FPGA implementation, as any IC may be used. Furthermore, even though detector 750 is generally described in terms of a hardware implementation, detector 750 may be implemented using a combination of hardware and software.

Error slicer 710 provides an error signal 711 as an output as associated with data voltage peak sampling, or more particularly sampling of symbols representing data, and crossing slicer 720 provides an error signal 721 as an output as associated with data voltage crossings sampling, or more particularly sampling of crossings of symbols representing data. However, for purposes of clarity and not limitation, sampling of symbols representing data is just referred to as sampling data or sampling data crossings, as applicable, for purposes of outputting sampled data.

An error slicer's output mean in a steady state may be referred to as "h0" and/or "Vpeak". A slicer error may be defined as a slicer input minus a slicer output mean, or generally a difference of input and mean output. When incoming data, such as via signaling 200, is random, namely has no correlation amongst itself, the mean of slicer error is conventionally zero. This is so because most conventional receivers are configured to minimize a mean squared error ("MMSE"). To minimize MMSE, conventionally a slicer is configured to position itself to sample at a position such that on an average the above quantity referred to as slicer error is zero.

With simultaneous reference to FIGS. 5, 6 and 7, flows 500 and 600, as well as receiver 700, are hereinafter simultaneously described.

At 501, input signaling, such as signaling 200 having symbols obtained from a communications channel, may be received by receiver 700. Error slicer 710, receives signaling 200, and in this example error slicer 710 samples the data in signaling 200 at a location that by default is one-half of a UI of an eye 201 from a data crossing edge. In other implementations, data may not be sampled at such a default location of an eye, such as some other default offset with which to start. For purposes of clarity and not limitation, it shall be assumed that such default PI code location 210 is sub-optimal and may be improved. Error slicer 710 is configured to compare such sampled data to a threshold, such as previously described herein, to generate an error signal 711, which may be used for one or more channel adaptation loops or loop blocks.

Likewise, at 501, crossing slicer 720 receives signaling 200, and in this example crossing slicer 720 samples data in signaling 200 at a zero crossing edge of an eye 201 to generate an error signal 721, where such error signal 721 includes timing information for clock data recovery. Again, in this example, slicers 710 and 720 sample 180 degrees apart from each other, namely at PI code locations 210 and 220 respectively, for PI code default settings of phase interpolators 788 and 787 respectively; however, in other implementations other phase relationships may be used as default settings.

Optionally, at 502, an adjustment value via adjustment value signal 771, as well as a threshold value via threshold value signal 772, may be input by a user to register or otherwise set those values. An adjustment value may be used as an increment or decrement value by detector 750. In this example, a default value of one tic of a UI of a PI code is used; however, more than one tic may be used in other configurations in order to more quickly resolve sampling position tuning. For a software implementation, this may be initialization of an adjustment value constant.

At 503, one or more loops or loop blocks associated with adaptation of receiver 700 to a communications channel, such as channel adaptive loop blocks 751 through 756 for example, may have their operations temporarily suspended responsive to assertion of flag signal 746 by detector 750. This temporary suspension or "freezing" of one or more of loop blocks 751 through 756, for example, of receiver 700 may be part of an initialization operation, including hardware or software initialization, of detector 750. Moreover, one or more of loop blocks 751 through 756 may be coupled to receive error or data signal 711. Optionally, for adaptation to a communications channel for an error slicer, only an error slicer reference loop may be temporarily suspended for sample position tuning, while one or more other loops may continue to run, such as in the background with respect to such tuning, so as not to disrupt a communication link for such communications channel.

At least one adaptive loop block may be coupled to receive flag signal 746. Examples of adaptive loop blocks may include one or more of a decision feedback equalization block or decision feedback equalizer ("DFE") 751, an automatic gain control block or automatic gain controller ("AGO") 752, a continuous time linear equalization block or continuous time linear equalizer ("CTLE") 753, an h0 or peak voltage detection block of Vpeak detector 754, a threshold unrolling (completely or partially) loop block or unrolled threshold loop ("UT") 755, and/or a link rate channel adaptation loop block or channel adapter 756. One or more of these or other blocks, having an operation that may be subject to output of error slicer 710 may be temporarily "frozen" responsive to assertion of flag signal 746.

At 504 and 604, it may be identified as to whether a current sampling phase for error slicer 710 is sufficiently close to an optimum sampling point or is at an optimum sampling point, respectively, for sampling symbols in signaling 200. If it is identified or determined at 504 or 604, as applicable, that a current sampling phase for error slicer 710 is sufficiently close to an optimum sampling point or is at an optimum sampling point, respectively, for sampling symbols in signaling 200, then an unfreezing and an outputting of data at 507 may be invoked via a branch 505 for software or a change of state 505 for an FSM. For example, flag signal 746 may be deasserted by an FSM and/or software of a controller 749 of detector 750 to remove such temporary suspension at 503 to allow error signal 711 from error slicer 710 to be used by one or more of such of adaptation loops or loop blocks 751 through 756. Such data output at 507 may be obtained at 507 by sampling of symbols in signaling 200 by error slicer 710 at such current sampling phase.

If, however, it is identified or determined at 504 or 604, as applicable, that a current sampling phase for error slicer 710 is not sufficiently close to an optimum sampling point or is not at an optimum sampling point, respectively, for sampling symbols in signaling 200, then a branch or change of state 506 may be invoked for operations at 511 or 611, respectively.

At 511 or 611, a direction in which to move, namely increment or decrement, a PI code location may be determined. In other words, detector 750 may be configured to determine which direction to adjust a PI code setting for phase interpolator 788. Detector 750 may provide such adjustment by PI set signal 784, which may be used for adjustment to either increment or decrement a current PI code location set in phase interpolator 788. Again, an adjustment value, such as provided by adjustment value signal 771, may be used to increment or decrement a current phase sampling location in phase interpolator 788 by increasing or decreasing a current PI code by at least one tic at a time. Again, even though the example of a single tic is used as an adjustment or delta value, more than a single tic of a UI may be used in other implementations to increase speed of sampling position tuning.

At 512, a direction determined at 511 or 611, respectively, may be moved to move or adjust a current sampling phase to provide a shift in phase sampling position in phase interpolator 788. Such shift is in a direction determined at 511 or 611, respectively, to adjust such current sampling phase of error slicer 710 as provided from phase interpolator 788 via current phase sampling signal 786. Thus, suppose for example, each tic of 60 tics of a UI represented a six degree shift, and a current sampling phase was set at a default value of 180 degrees. Controller 749 may be configured to provide PI set signal 784 incremented or decremented in value by one tic, or one six degree shift in this example, to move a current sampling phase closer or farther, respectively, in phase with respect to a reference sampling phase of crossing slicer 720. Optionally, controller 749 may be configured to set a reference sampling phase of phase interpolator 787 via a PI set signal 783 provided thereto from controller 749. In this example, it is assumed that a reference sampling phase of phase interpolator 787 is set to and held at 360 or 0 degrees, and accordingly crossing slicer 720 has a fixed sampling phase of 360 or 0 degrees in response to current phase sampling signal 785 provided from phase interpolator 787 to crossing slicer 720.

At 513 or 613 respectively, a current sampling phase may be reset or adjusted that moves a current PI code location 210 closer to an optimal PI code location 299 for example in any of FIGS. 2 through 4. This may be done in software by setting a current sampling phase with a shift, left or right by an adjustment value, equal to a current sampling phase. In hardware, a default value PI code location, stored in a memory or other storage for example of controller 749, may be shifted, left or right by an adjustment value, and such resulting shifted PI code setting may be rewritten to such memory for subsequent output as PI set signal 784 for setting phase interpolator 788 with such a current phase sampling point. These are just two examples of many possible implementations for updating and storing a PI code setting for a phase interpolator 788 for subsequent output via PI set signal 784. Along those lines, a sampling position tuning loop 510 or 610 may be repeated, as indicated by branch or state setting 514, to repeat identifying operations at 504 or 604, respectively. Such repetition may be repeated until a current sampling phase of error slicer 710 is sufficiently close to or at an optimum sampling point, as previously described for operations at 504 and 604, respectively.

Error slicer 710 may have its error signal 711 output averaged, such as by a running average block or module 730 of detector 750. Accordingly, error signal 711 may be provided to a running average module 730 to provide a running average via running average signal 703 to controller 749. However, for purposes of clarity by way of example and not limitation, it shall be assumed that only a single slicer, error slicer 710 or crossing slicer 720 is used.

Running average module 730 may include an infinite impulse response ("IIR") filter or a finite impulse response filter ("FIR") 739 for determination of such running average. Optionally, running average module 730 may include an accumulator configured to provide a running average. For purposes of clarity and not limitation, it shall be assumed that an IIR filter 739 is used, though other circuitry implementations may be used for determining a running average.

Figure 8:
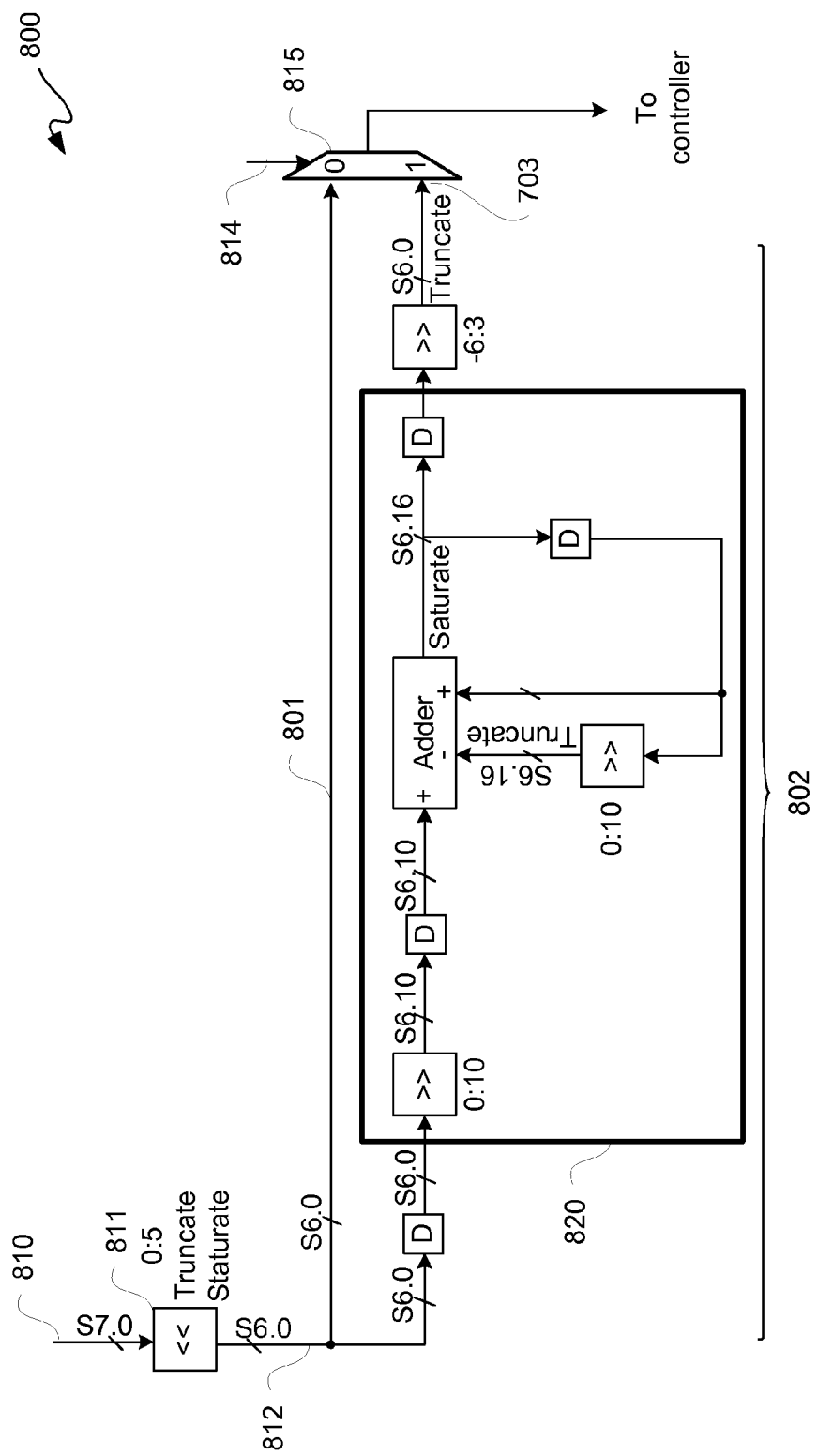
FIG. 8 is a block/circuit diagram depicting an exemplary infinite impulse response ("IIR") filter.

FIG. 8 is a block/circuit diagram depicting an exemplary IIR filter 800. In this example, IIR filter 800 includes a bypass path 801 and a leaky integrator path 802. In this example, a sign bit ("S") as part of an 8-bit data input is provided as an input 810 to a left bit shifter ("<<") 811 to saturate and to truncate such input 810 to provide an output 812. The example bit widths or other bit widths may be used to provide an IIR filter 800. Furthermore, this or another IIR filter circuit may be used. Output 812 is provided via bypass path 801 as an input to multiplexer 815 and as an input to leaky integrator path 802. A leaky integrator 820 of leaky integrator path 802 may include delay elements ("D"), a three input adder, and right bit shifters (">>"), as well as other circuitry. As leaky integrators are known, description of leaky integrator path 802 is not provided for purposes of clarity and not limitation.

An IIR filter 739 of FIG. 7 may include a leaky integrator for providing a running average signal 703. Input 810 may be error signal 711 of FIG. 7. Output of leaky integrator path 802 may be a running average signal, such as running average signal 703 for example. Running average signal 703 may be provided as an input to controller 749, as previously described. A control select signal 814 provided to multiplexer 815 may be used to select between output 812 and running average signal 703 for output from multiplexer 815.

Figures 1, 9:
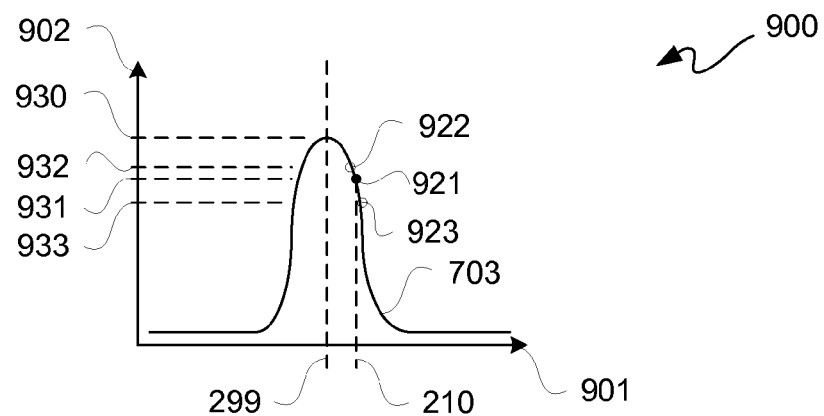
Figures 2, 9:
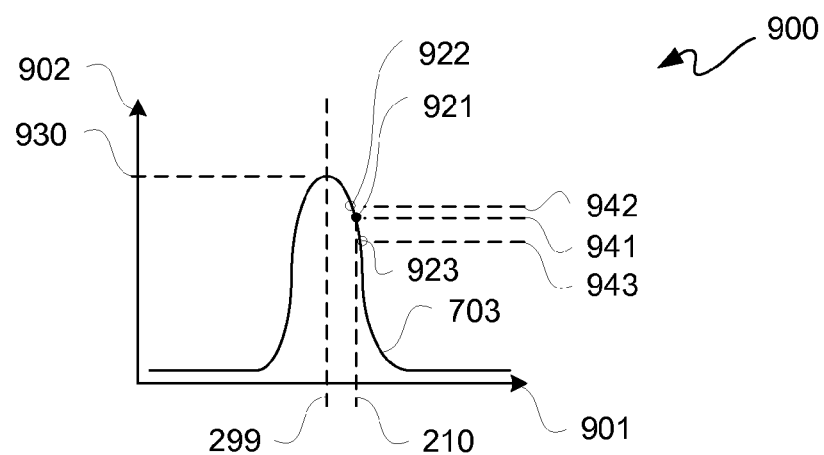

FIGS. 9-1 and 9-2 are the same graphical diagram depicting an exemplary sampling instance of a data crossing ("d× d") versus error slicer output mean plot for a curve 900. Curve 900 has an inverted "U-like" shape for a portion of interest, which may or may not be symmetric about an optimum sampling position 299. In short, curve 900 has a maxima, which is always located "uphill" until reached.

For each plot of curve 900, a running average or error slicer output mean of running average signal 703 along a vertical axis 902 may be plotted for a plurality of sampling positions of instances of data crossings for a UI of a PI code along a horizontal axis 901. Such curve 900 indicates that, at an optimum sampling position 299, a maximum mean value 930 is sampled or output by error slicer 710 of FIG. 7. Assuming a current sampling position 210 is at a point 921 on curve 900 and yields a mean value 931, if an adjustment value is made to both the left and the right of such current sampling position, namely incrementing and decrementing a current sampling position by an adjustment value, then two other points 922 and 923 on curve 900 may be obtained along with mean values 932 and 933 respectively therefor. As an optimum sampling position 299 lies in a direction of increasing magnitude, outcome of incrementing and decrementing may be used to determine which direction to shift a current PI code location to move at least toward an optimum sampling position 299, whether a current sampling position 210 is to the right (as in the example of FIG. 9-1) or to the left of such optimum sampling position 299. Thus, magnitudes may be used to determine a direction to move, and as previously described, FIG. 5 is a flow diagram depicting an exemplary sample position tuning flow 500 using magnitudes.

Curve 900 of FIG. 9-2 is the same as that of FIG. 9-1; however, rather than using magnitudes, relative position may be used as follows. Assuming a current sampling position 210 is at a point 921 on curve 900, and such point is set as a relative zero position 941. Again, if an adjustment value is made to both the left and the right of such current sampling position, namely incrementing and decrementing a current sampling position by an adjustment value, then two other points 922 and 923 on curve 900 along with their respective signs 942 and 943 relative to zero position 941 may be determined. In this example, a sign of an error slicer output mean for a data clock ("dCLK") PI code at point 922 is a plus 1 (+1) relative to a current sampling position at point 921, and a sign of an error slicer output mean for a data clock PI code at point 923 is a minus 1 (−1) relative to a current sampling position at point 921. In other words, when a PI code is changed by an increment or a decrement by an adjustment value, namely a +Δ or a −Δ, respectively, an error slicer output changes sign if a data clock is more out of phase. As an optimum sampling position 299 lies in a direction of a +1, namely SIGN(Error_Slicer_Mean(dCLK_PI_Code))=1 and not −1, namely going "uphill" and not "downhill", outcome of incrementing and decrementing may be used to determine which direction to shift a current PI code location to move at least toward an optimum sampling position 299, whether a current sampling position 210 is to the right (as in the example of FIG. 9-1) or to the left of such optimum sampling position 299. Thus, relative position may be used to determine a direction to move, and as previously described, FIG. 6 is a flow diagram depicting an exemplary sample position tuning flow 600 using relative position.

Along the above lines, if signs for both incrementing and decrementing, are equal, namely SIGN(Error_Slicer_Mean (dCLK_PI_Code_plus))=SIGN(Error_Slicer_Mean(dCLK_PI_Code_minus)), then a current sampling position is at an optimum sampling position 299 for a system granularity. For example, if an adjustment value of 1 tic of a UI is the finest granularity of adjustment of a phase interpolator, and if signs are equal for both incrementing and decrementing using such 1 tic, then for practical purposes an optimum sampling position 299 has been tuned in for a receiver of such granularity. Again, this is in reference to a data crossing. Stated another way, a sampling point is optimum if a curve for a sampling instance data crossing versus an error slicer mean exhibits maxima at such sampling point. However, if such sampling point is not optimum, the direction in which an optimum sampling point lies can be determined by looking at the sign of an error slicer mean around such sampling point sample by moving such sampling point forward and backward in phase. Again, an optimum point lies in the direction where an error slicer mean is positive for a receiver, where error slicer mean at a current sampling location is equal to zero for random and non-random data for such receiver.

With the above description borne in mind, flow diagrams respectively of FIGS. 10-1, 10-2, 11-1, 11-2, 12-1, and 12-2 are described with reference to receiver 700 of FIG. 7. However, it should be appreciated that a controller, such as controller 749 for example, may be implemented in hardware and/or software for carrying out the following operations. Furthermore, detector 750 may be implemented in whole or in part using programmable resources of an FPGA; however, in other configurations dedicated resources may be used exclusively to implement detector 750. Generally, detector 750 changes conditions until an optimum sampling position for an error slicer 710 is detected. As this is an iterative process, effectively detector 750 may be used as a sampling position tuner. Along those lines detector 750 may be used to automatically find an optimal sampling position, or within a threshold range thereof, of a receiver 700.

Figures 1, 10:
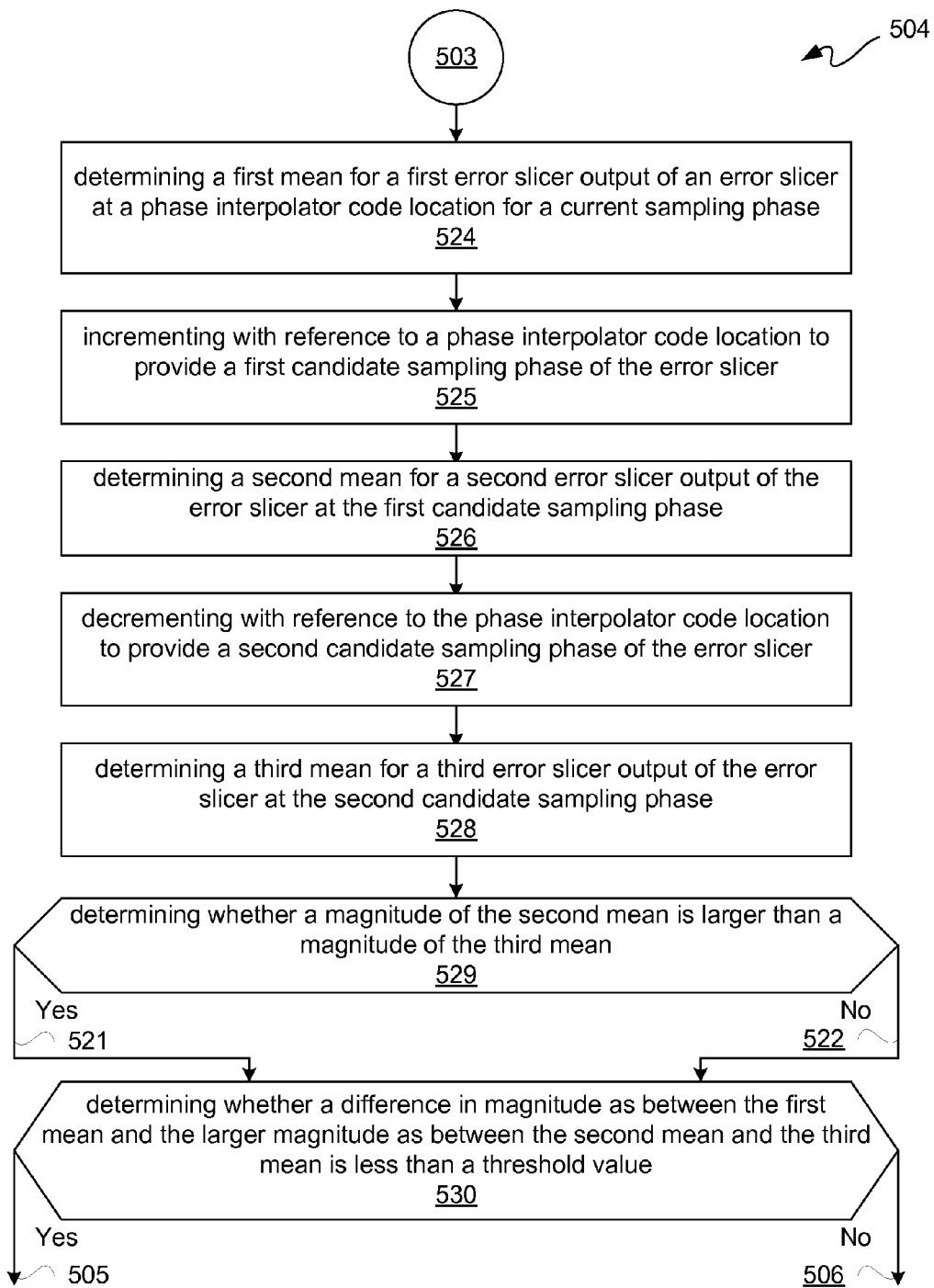
Figures 2, 10:
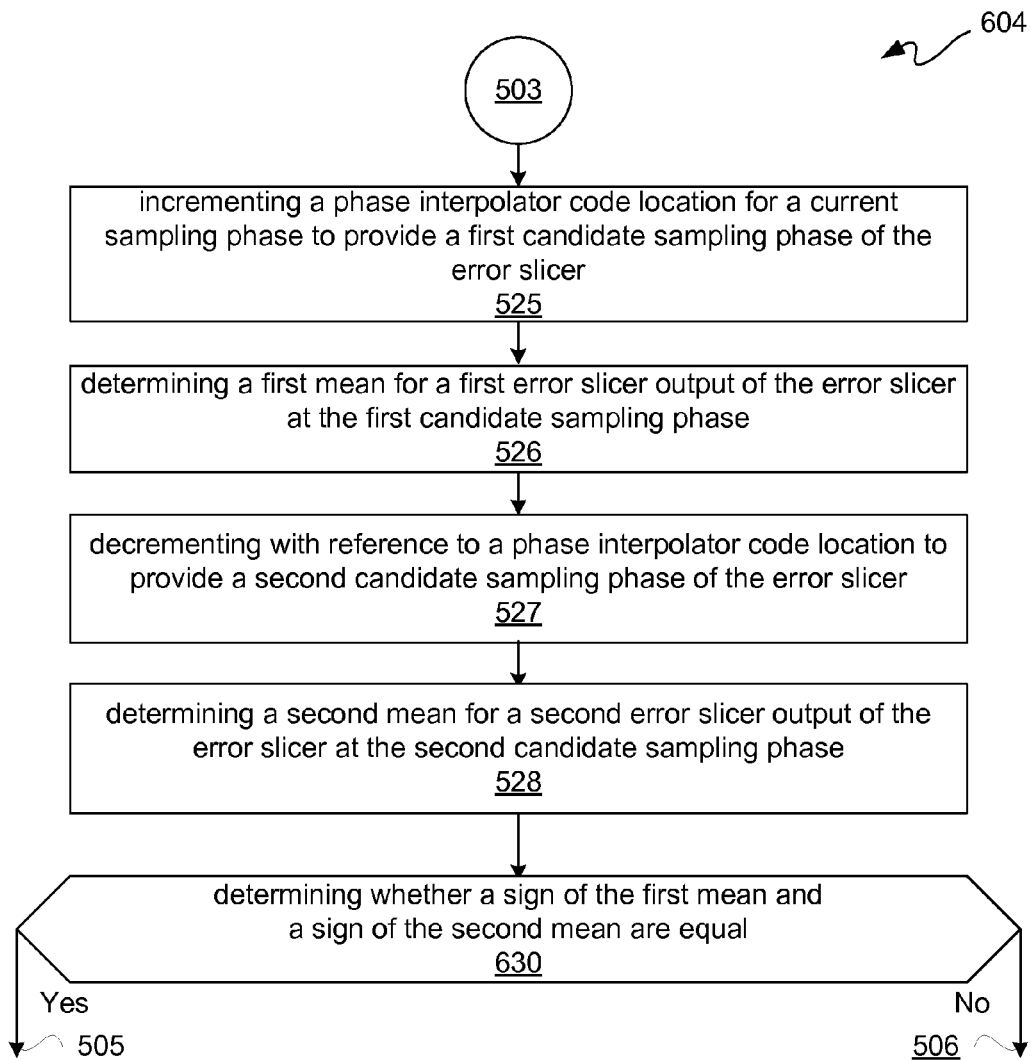

FIG. 10-1 is a flow diagram depicting exemplary operations for identifying a direction at 504. FIG. 10-1 is further described with simultaneous additional reference to FIGS. 5, 7 and 9-1.

From 503, at 524, a first mean is determined for a first error slicer output 711 of error slicer 710 at a PI code location for a current sampling phase. At 525, such PI code location is incremented, such as by an adjustment value therefrom, to provide a first candidate sampling phase for error slicer 710. At 526, a second mean is determined for a second error slicer output 711 of error slicer 710 at such first candidate sampling phase.

At 527, with reference to such PI code location at 524, a second candidate sampling phase for error slicer 710 is provided by decrementing, such as by two adjustment values from such first candidate sampling phase, to decrement by an adjustment value from such PI code location of the current sampling phase at 524. At 528, a third mean is determined for a third error slicer output 711 of error slicer 710 at such second candidate sampling phase. Even though in this example, incrementing at 525 preceded decrementing at 527 is used, a reverse order may be used as should be understood.

Operations for incrementing, decrementing, and determining first, second, and third means may be provided with controller 749. For example, controller 749 may have an FSM configured to increment and decrement from a current sampling phase, as well as registers or other storage devices for storing first through third means. Storage operations and other unnecessary details are not described herein for purposes of clarity and not limitation. Likewise, controller 749 may include one or more magnitude blocks for determining magnitudes of such first through third means, as well as an adder-subtractor to determine a difference, as described below in additional detail.

At 529, it is determined whether magnitude of the second mean determined at 526 is larger than magnitude of the third mean. If magnitude of the second mean is larger than magnitude of the third mean, then as indicated by branch 521 such second mean is used at 530. If, however, magnitude of the second mean is not larger than magnitude of the third mean, then as indicated by branch 522 such third mean is used at 530.

At 530, it is determined whether a difference in magnitude as between the first mean determined at 524 and the larger magnitude as between the second mean and the third mean is less than a threshold value. Optionally, a user may set a threshold value, which may be provided to controller 749 via threshold value signal 772. However, controller 749 may be configured with a default threshold value. If such difference is less than a threshold value, then branch 505 may be invoked to output data. If, however, such difference is not less than such a threshold value, then branch 506 may be invoked to perform another tuning iteration. Accordingly, identifying a direction at 504 may be used along the lines of the example of using magnitudes in FIG. 9-1.

FIG. 10-2 is a flow diagram depicting exemplary operations for identifying a direction at 604. FIG. 10-2 is further described with simultaneous additional reference to FIGS. 6, 7 and 9-2.

From 503, at 525, a PI code location for a current sampling phase is incremented, such as by an adjustment value therefrom, to provide a first candidate sampling phase for error slicer 710. At 526, a first mean is determined for a first error slicer output 711 of error slicer 710 at such first candidate sampling phase. At 527, with reference to such PI code location at 524, a second candidate sampling phase for error slicer 710 is provided by decrementing, such as by two adjustment values from such first candidate sampling phase, to decrement by an adjustment value from such PI code location of the current sampling phase at 525. At 528, a second mean is determined for a second error slicer output 711 of error slicer 710 at such second candidate sampling phase. Even though in this example, incrementing at 525 preceded decrementing at 527 is used, a reverse order may be used as should be understood.

Operations 525 through 528 of FIG. 10-2 are similar to operations 525 through 528 of FIG. 10-1. Again, operations for incrementing, decrementing, and determining first, second, and third means may be provided with controller 749. For example, controller 749 may have an FSM configured to increment and decrement from a current sampling phase, as well as registers or other storage devices for storing first through third means. Storage operations and other unnecessary details are not described herein for purposes of clarity and not limitation. Likewise, controller 749 may include one or more magnitude blocks for determining magnitudes of such first through third means, as well as an adder-subtractor to determine a difference, as described below in additional detail.

At 630, it is determined whether a sign of the first mean determined at 525 and a sign of the second mean determined at 528 are equal, namely whether both means are −1. If both signs are equal, then an optimum sampling position for receiver 700 has been located or tuned-in, and data may be output as generally indicated by branch 505. If, however, such signs of such first mean and second mean are not equal, namely one is +1 and the other is −1, then branch 506 may be invoked to perform another tuning iteration. Accordingly, identifying a direction at 604 may be used along the lines of the example of using relative position in FIG. 9-2.

Figures 1, 11:
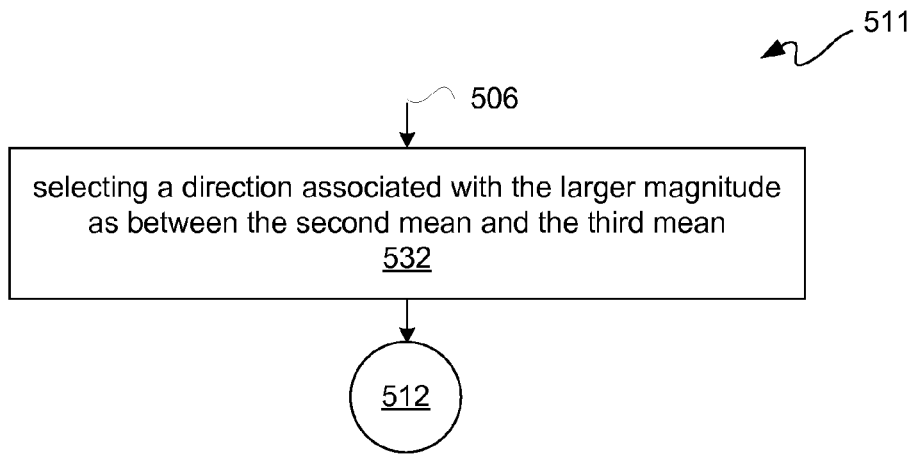

FIG. 11-1 is a flow diagram depicting exemplary operations for determining a direction to move at 511. FIG. 11-1 is further described with simultaneous additional reference to FIGS. 5, 7, 9-1 and 10-1.

From branch 506, at 532 a direction is selected for a larger magnitude as between a second mean and a third mean as determined at 529. Such selected direction is used to move a PI code for phase interpolator 788 in a direction of increasing magnitude. After 532, operations at 512 may be performed.

FIG. 11-2 is a flow diagram depicting exemplary operations for determining a direction to move at 611. FIG. 11-2 is further described with simultaneous additional reference to FIGS. 6, 7, 9-2 and 10-2.

From branch 506, at 631 it may be determined which of the first mean and the second mean respectively determined at 526 and 528 is positive. For the positive one of such two means, a direction may be selected corresponding to such positive mean in order to move in a direction of increasing magnitude. Accordingly, at 632 the direction associated with the positive one of the first mean and the second mean may be selected. After 632, operations at 512 may be performed.

Figures 1, 12:
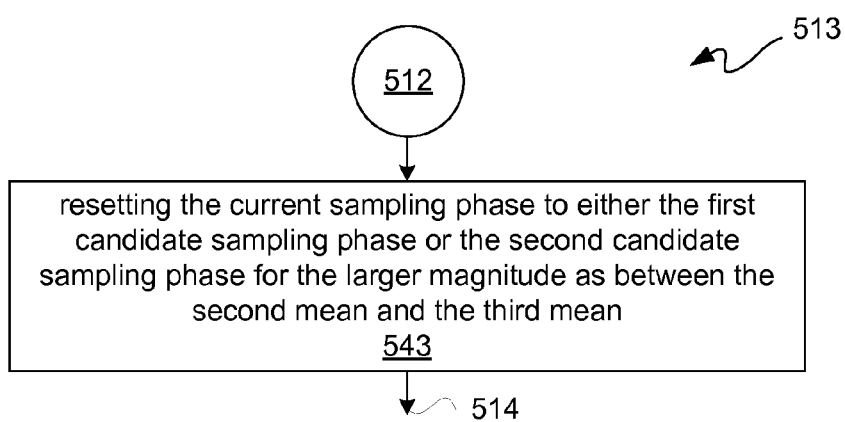
Figures 2, 11:
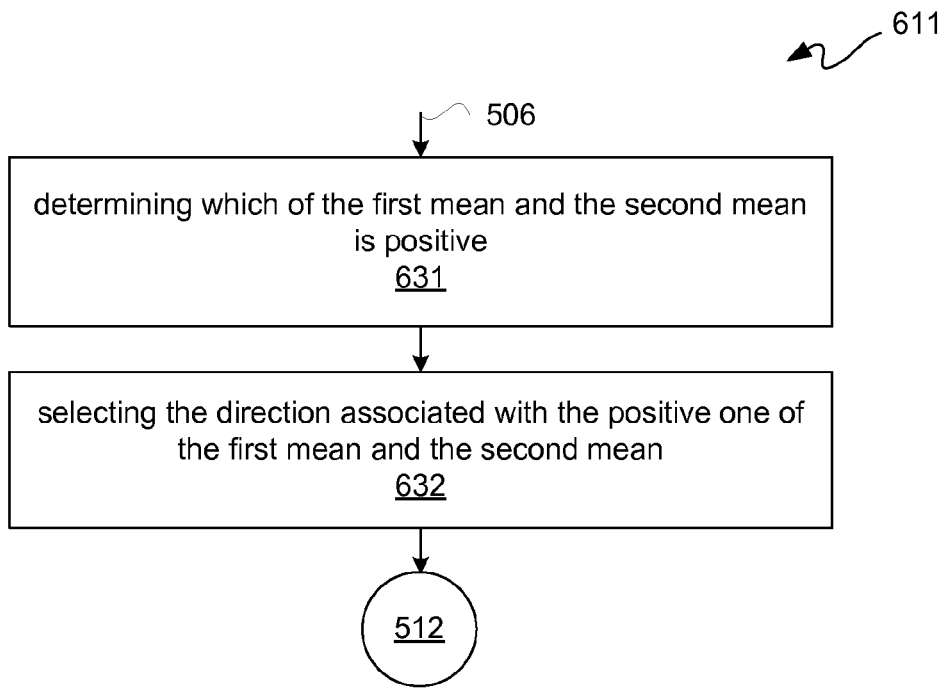
Figures 2, 12:
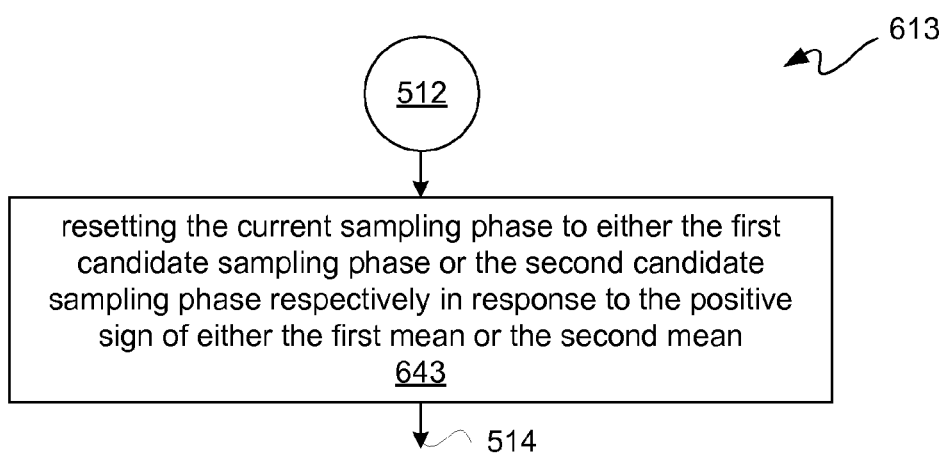

FIG. 12-1 is a flow diagram depicting exemplary operations for resetting at 513. FIG. 12-1 is further described with simultaneous additional reference to FIGS. 5, 7, 9-1, 10-1, and 11-1. From 512, at 543, a current sampling phase or phase interpolator code location at 524 is reset to either the first candidate sampling phase or the second candidate sampling phase respectively provided at 525 and 527 for the larger magnitude as between the second mean and the third mean as determined at 529. After 543, another iteration of sampling position tuning loop 510 may be performed as generally indicated by branch 514. Thus, for example, identifying at 504 may be repeated with a current sampling phase as reset to the current sampling to an incremented or decremented version thereof, namely to a current sampling phase anew.

FIG. 12-2 is a flow diagram depicting exemplary operations for resetting at 613. FIG. 12-2 is further described with simultaneous additional reference to FIGS. 6, 7, 9-2, 10-2, and 11-2. From 512, at 643, a current sampling phase or phase interpolator code location at 525 is reset to either the first candidate sampling phase or the second candidate sampling phase respectively provided at 525 and 527 for the positive sign as between the first mean and the second mean as determined at 631. Only one of such signs at 631 may be positive, and thus either the first mean or the second mean thereof may have a positive sign. After 643, another iteration of sampling position tuning loop 610 may be performed as generally indicated by branch 514. Thus, for example, identifying at 604 may be repeated with a current sampling phase as reset to a prior current sampling phase.

In the past, heuristics may have been used to manually adjust sampling position for a mismatch in delay. Along those lines, it should be understood that eye shape may vary from communication channel to communication channel, and so heuristics may not have addressed eye asymmetry. In contrast, data crossings are more a function of layout on a chip, which may be estimated via heuristics albeit this is a very long and tedious process, repeated across temperature ranges and manufacturing corners for each IC.

However, as described above, a systematic sampling position tuning is described based on optimization of sampling point, and such may be used to automatically adjust or tune a sampling position to or toward an optimum value therefor. In other words, heuristics used for adjusting for mismatched delays may be avoided. Furthermore, in the past, such heuristics may have only been applicable to data crossings, and thus not addressed eye asymmetry. However, eye asymmetry may be addressed in a systematic way as described above, which may be automated. Thus, each IC may be configured to automatically adjust to one or more communications channels, and to self-adjust to account for delay mismatches that may be associated with data crossings. Because locating an optimum sampling position or thereabouts as described herein effectively is a systematic way to maximize an SNR in a receiver, it may additionally be more reliable and accurate than using heuristics.

Figure 13:
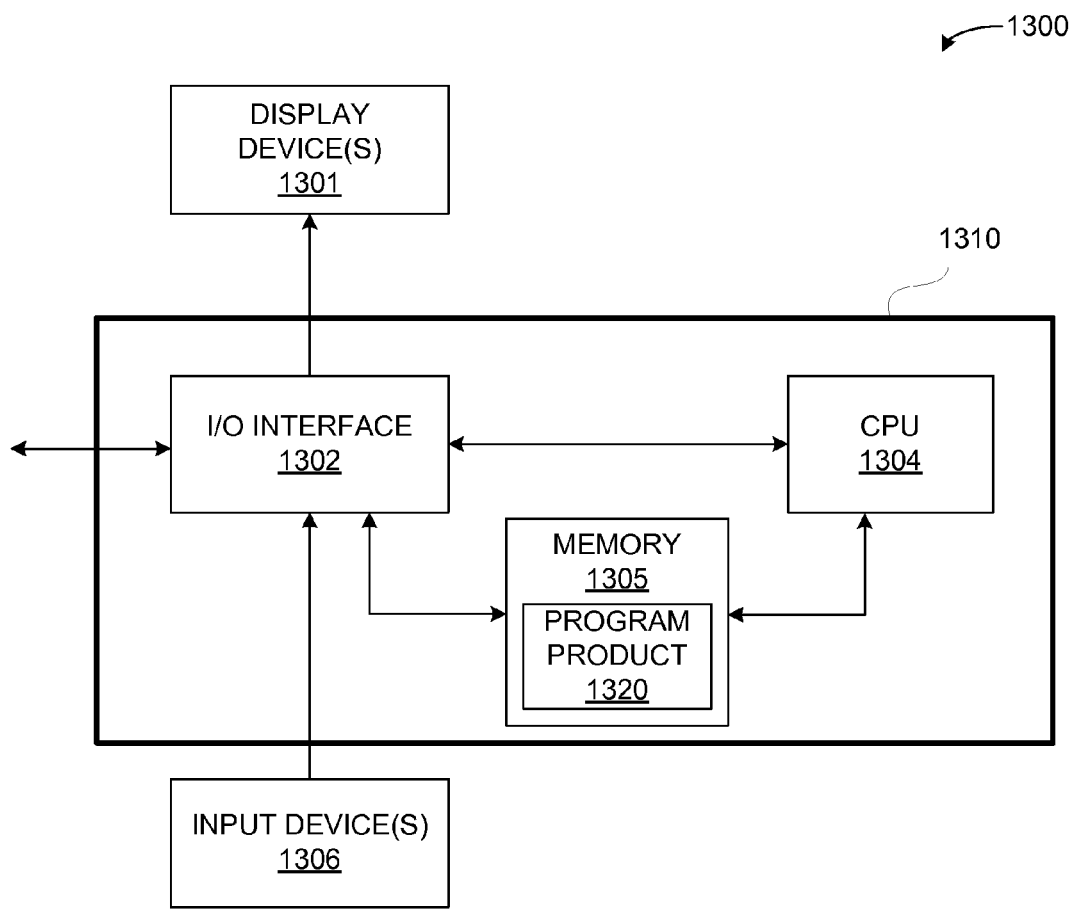
FIG. 13 is a block diagram depicting an exemplary computer system.

FIG. 13 is a block diagram depicting an exemplary computer system 1300. Computer system 1300 may include a programmed computer 1310 coupled to one or more display devices 1301, such as Cathode Ray Tube ("CRT") displays, plasma displays, Liquid Crystal Displays ("LCD"), projectors and to one or more input devices 1306, such as a keyboard and a cursor pointing device. Other known configurations of a computer system may be used. Computer system 1300 by itself or networked with one or more other computer systems 1300 may provide an information handling system.

Programmed computer 1310 may be programmed with a known operating system, which may be Mac OS, Java Virtual Machine, Real-Time OS Linux, Solaris, iOS, Android Linux-based OS, Unix, or a Windows operating system, among other known platforms. Programmed computer 1310 includes a central processing unit (CPU) 1304, memory 1305, and an input/output ("I/O") interface 1302. CPU 1304 may be a type of microprocessor known in the art, such as available from IBM, Intel, ARM, and Advanced Micro Devices for example. Support circuits (not shown) may include cache, power supplies, clock circuits, data registers, and the like. Memory 1305 may be directly coupled to CPU 1304 or coupled through I/O interface 1302. At least a portion of an operating system may be disposed in memory 1305. Memory 1305 may include one or more of the following: flash memory, random access memory, read only memory, magneto-resistive read/write memory, optical read/write memory, cache memory, magnetic read/write memory, and the like, as well as non-transitory signal-bearing media as described below.

I/O interface 1302 may include chip set chips, graphics processors, and/or daughter cards, among other known circuits. An example of a daughter card may include a network interface card ("NIC"), a display interface card, a modem card, and a Universal Serial Bus ("USB") interface card, among other known circuits. Thus, I/O interface 1302 may be coupled to a conventional keyboard, network, mouse, display printer, and interface circuitry adapted to receive and transmit data, such as data files and the like. Programmed computer 1310 may be coupled to a number of client computers, server computers, or any combination thereof via a conventional network infrastructure, such as a company's Intranet and/or the Internet, for example, allowing distributed use for interface generation.

Memory 1305 may store all or portions of one or more programs or data to implement processes in accordance with one or more embodiments hereof to provide program product 1320. Additionally, those skilled in the art will appreciate that one or more embodiments hereof may be implemented in hardware, software, or a combination of hardware and software. Such implementations may include a number of processors or processor cores independently executing various programs and dedicated hardware or programmable hardware.

One or more program(s) of program product 1320, as well as documents thereof, may define functions of embodiments hereof and can be contained on a variety of non-transitory signal-bearing media, such as computer-readable media having code, which include, but are not limited to: (i) information permanently stored on non-writable storage media (e.g., read-only memory devices within a computer such as CD-ROM or DVD-ROM disks readable by a CD-ROM drive or a DVD drive); or (ii) alterable information stored on writable storage media (e.g., floppy disks within a diskette drive or flash drive or hard-disk drive or read/writable CD or read/writable DVD). The above embodiments specifically include information downloaded from the Internet and other networks. Such non-transitory signal-bearing media, when carrying computer-readable instructions that direct functions hereof, represent embodiments hereof.

While the foregoing describes exemplary apparatus(es) and/or method(s), other and further examples in accordance with the one or more aspects described herein may be devised without departing from the scope hereof, which is determined by the claims that follow and equivalents thereof. Claims listing steps do not imply any order of the steps. Trademarks are the property of their respective owners.

What is claimed is:

1. An apparatus, comprising:
   a phase interpolator;
   a detector;
   a slicer coupled to the phase interpolator for providing a sampling signal for a sampling position of the phase interpolator;
   the detector being coupled to the slicer for receiving the sampling signal;
   the detector for adjusting a code of the phase interpolator to adjust the sampling position in response to the sampling signal;
   the detector including a running average module for receiving the sampling signal for providing a running average signal;
   the detector including a controller for receiving the running average signal for providing a set signal to the phase interpolator; and
   the controller for adjusting the code of the phase interpolator for adjusting the sampling position responsive to the sampling signal for tuning the sampling position.

2. The apparatus according to claim 1, the slicer comprising an error slicer.

3. The apparatus according to claim 1, the running average module including at least one of an infinite impulse response filter or a finite impulse response filter.

4. The apparatus according to claim 1, wherein:
   the controller for adjusting the code of the phase interpolator to adjust the sampling position iteratively in response to the sampling signal to tune the sampling position toward an optimum; and
   the controller is coupled to the phase interpolator for providing a phase interpolator code location to the phase interpolator to adjust the code of the phase interpolator.

5. The apparatus according to claim 2, further including a crossing slicer.

6. The apparatus according to claim 1, wherein the controller is configured to:
   temporarily suspend operation of a loop associated with adaptation to a communications channel for the slicer; and
   identify whether a sampling phase for the slicer is sufficiently close to an optimum to release the loop from being temporarily suspended.

7. The apparatus according to claim 2, wherein the apparatus comprises a receiver, and the controller is for:
   temporarily suspending operation of a loop of the receiver associated with adaptation to a communications channel for the error slicer; and
   identifying whether the sampling phase for the error slicer is sufficiently close to an optimum to release the loop from being temporarily suspended.

8. The apparatus according to claim 7, wherein the controller in order to identify whether the sampling phase for the error slicer is sufficiently close to the optimum is for:
   determining a first mean for the running average of a first error slicer output of the error slicer at the phase interpolator code location for a current sampling phase;
   incrementing with reference to the phase interpolator code location to provide a first candidate sampling phase of the error slicer;
   determining a second mean for the running average of a second error slicer output of the error slicer at the first candidate sampling phase;
   decrementing with reference to the phase interpolator code location to provide a second candidate sampling phase of the error slicer;
   determining a third mean for the running average of a third error slicer output of the error slicer at the second candidate sampling phase;
   determining whether a magnitude of the second mean is larger than a magnitude of the third mean; and
   determining whether a difference in magnitude as between the first mean and the larger magnitude as between the second mean and the third mean is less than a threshold value.

9. The apparatus according to claim 7, wherein the controller in order to identify whether the sampling phase for the error slicer is at the optimum is for:
   incrementing with reference to the phase interpolator code location for a current sampling phase to provide a first candidate sampling phase of the error slicer;
   determining a first mean for the running average of a first error slicer output of the error slicer at the first candidate sampling phase;
   decrementing with reference to the phase interpolator code location to provide a second candidate sampling phase of the error slicer;
   determining a second mean for the running average of a second error slicer output of the error slicer at the second candidate sampling phase; and
   determining whether a sign of the first mean and a sign of the second mean are equal.

10. The apparatus according to claim 7, wherein the controller is for:
    determining a direction to move the phase interpolator code location for the phase interpolator; and
    sending the set signal to the phase interpolator to move the sampling position in the direction determined to provide a shift from the phase interpolator location in the direction determined to adjust the sampling position of the error slicer.

11. An apparatus, comprising:
a phase interpolator;
a detector;
a slicer coupled to the phase interpolator for providing a sampling signal for a sampling position of the phase interpolator;
the detector being coupled to the slicer for receiving the sampling signal;
the detector including a running average module for receiving the sampling signal for providing a running average signal;
the detector including a controller for receiving the running average signal for providing a set signal to the phase interpolator;
the controller for adjusting the code of the phase interpolator for adjusting the sampling position responsive to the sampling signal for tuning the sampling position; and
wherein the detector is for adjusting the code of the phase interpolator to adjust the sampling position iteratively in response to the sampling signal.

12. The apparatus according to claim 11, wherein the slicer comprises an error slicer.

13. The apparatus according to claim 11, the running average module including at least one of an infinite impulse response filter or a finite impulse response filter.

14. The apparatus according to claim 12, further including a crossing slicer.

15. An apparatus, comprising:
a phase interpolator;
a detector;
a slicer coupled to the phase interpolator for providing a sampling signal for a sampling position of the phase interpolator;
the detector being coupled to the slicer to receive the sampling signal;
the detector including a running average module for receiving the sampling signal for providing a running average signal;
the detector including a controller for receiving the running average signal for providing a set signal to the phase interpolator;
the controller for adjusting the code of the phase interpolator for adjusting the sampling position responsive to the sampling signal for tuning the sampling position; and
wherein the detector is for adjusting the code of the phase interpolator to adjust the sampling position to tune the sampling position toward an optimum.

16. The apparatus according to claim 15, wherein the slicer comprises an error slicer.

17. The apparatus according to claim 15, the running average module including at least one of an infinite impulse response filter or a finite impulse response filter.

18. The apparatus according to claim 16, further including a crossing slicer.

* * * * *